United States Patent
Rosenthal et al.

[11] Patent Number: 6,161,054
[45] Date of Patent: Dec. 12, 2000

[54] CELL CONTROL METHOD AND APPARATUS

[75] Inventors: Peter A. Rosenthal, West Simsbury; Peter R. Solomon, West Hartford; Anthony S. Bonanno, Windsor; William J. Eikleberry, Coventry, all of Conn.

[73] Assignee: On-Line Technologies, Inc., East Hartford, Conn.

[21] Appl. No.: 09/156,277

[22] Filed: Sep. 17, 1998

Related U.S. Application Data

[60] Provisional application No. 60/059,435, Sep. 22, 1997.

[51] Int. Cl.$^7$ ....................................... G06F 19/00
[52] U.S. Cl. ........................... 700/121; 700/101; 700/102; 700/111; 414/217; 414/227; 250/339.08; 250/339.11; 250/339.27; 438/220; 438/231; 438/232
[58] Field of Search ..................... 700/111, 121, 700/101, 102, 105, 110; 438/220, 231, 232; 714/805, 48; 73/865.8; 414/217, 222.13, 227, 805, 806, 939, 940; 382/141, 209, 217, 254; 250/339.08, 339.11, 339.27

[56] References Cited

U.S. PATENT DOCUMENTS

| | | |
|---|---|---|
| 5,392,118 | 2/1995 | Wickramasinghe ...................... 356/355 |
| 5,604,581 | 2/1997 | Lui et al. .................................... 356/73 |
| 5,795,356 | 8/1998 | Leveen ................................... 29/25.01 |
| 5,846,849 | 12/1998 | Shaw et al. ................................. 438/52 |
| 5,900,633 | 5/1999 | Solomon et al. ................... 250/339.08 |
| 5,926,690 | 7/1999 | Toprac et al. ................................ 438/17 |
| 5,930,586 | 7/1999 | Jain et al. .................................... 438/14 |
| 5,948,958 | 9/1999 | Bang et al. ................................. 73/1.36 |
| 5,951,770 | 9/1999 | Perlov et al. ............................. 118/719 |
| 5,957,648 | 9/1999 | Bachrach ................................. 414/217 |
| 5,964,561 | 10/1999 | Marohl ..................................... 414/217 |
| 6,051,866 | 4/2000 | Shaw et al. .............................. 257/417 |
| 6,073,501 | 6/2000 | Rohner .................................... 73/865.8 |

OTHER PUBLICATIONS

Dance. et al., "Modeling HTE Cost of Ownership of Assembly and Inspection", IEEE., pp. 57–60, 1996.

Dance., "Modeling HTE Cost of Ownership of Assembly and Inspection", IEEE., pp. 51–54, 1995.

Janiak et al., "Investigation of Macroscopic Uniformity During CH/sub 4//H/sub2 Reactive Ion Etching of InP and Improvement Using a Quard Ring", IEEE., pp. 111–114, 1996.

Primary Examiner—Albert De Cady
Assistant Examiner—McDieunel Marc
Attorney, Agent, or Firm—Ira S. Dorman

[57] ABSTRACT

An implementation of sensor-driven run-to-run process control for semiconductor wafer fabrication integrates a robust, automated Fourier transform infrared reflectometer onto a wafer fabrication cluster tool. Cell controller software integrates an adaptive run-to-run controller, process tool recipe upload and download through a SECS port, sensor control, data archiving, and a graphical user interface.

13 Claims, 7 Drawing Sheets

CELL CONTROL METHOD AND APPARATUS

CROSS-REFERENCE TO RELATED PROVISIONAL APPLICATION

This application claims the benefit of provisional application No. 60/059,435, bearing the foregoing title and filed on Sep. 22, 1997 in the names of the inventors designated herein.

FEDERALLY SPONSORED RESEARCH OR DEVELOPMENT

The United States Government has rights in this invention pursuant to Contract No. DMI-9660643, awarded by the National Science Foundation.

BACKGROUND OF THE INVENTION

Historical trends in the production of the semiconductor integrated circuits have been to increase device density at lower cost per circuit, and at high yield. Opportunities now exist to substantially improve the availability, reliability, and performance of semiconductor devices while simultaneously reducing manufacturing cycle time, reducing thermal budgets, and increasing product yields. It is believed that these benefits will, in the future, be largely realized by adopting technology for the sensing and control of processing steps in the manufacturing of semiconductor devices. The benefits of closed loop control, compared to fixed set point control, are summarized below:

| Sensor Driven Closed Loop Control | Fixed Set Point Control |
| --- | --- |
| Immediate measurements on every wafer | Delayed measurements |
| No extra wafer handling | Sporadic measurements |
| Automatic closed loop control | Extra wafer handling |
| Potential Overall Equipment Effectiveness (OEE) about 57% | Operator required OEE about 30% |
| Tighter product specification | Looser specifications |

In current practice, fixed set point control is typically used for process steps, with reactor recipes being set so that a parameter value matches a target specification. As illustrated in appended FIG. 1(a), the process is run until the parameter value (as determined by measurements on one in 25 or one in 50 wafers) is outside preset limits, at which time the process is stopped and the reactor is retuned. This practice results in substantial down-time for process retuning, the productions of substantial amounts of scrapped material before the process is stopped, and substantially wider variations in the product specifications than necessary.

SUMMARY OF THE INVENTION

It is a broad object of the present invention to provide a novel cell control method, apparatus, and system whereby and wherein trends of departures from target values of one or more properties of semiconductor wafers can be detected in line and during fabrication, and whereby and wherein adjustments can be made in processing conditions so as to minimize or eliminate such departures in wafers subsequently fabricated.

A more specific object of the invention is to provide such a method, apparatus, and system which are especially well suited for the fabrication of semiconductor wafers (including those that are patterned) on a production basis, and which enable measurement and control of many properties that are essential to satisfactory wafer performance, especially layer thickness and composition.

It has now been found that certain of the foregoing and related objects of the invention are attained by the provision of apparatus comprising a Fourier transform infrared (FTIR) reflectometer for measuring, in a fabrication tool, at least one property of each of a series of semiconductor wafers sequentially processed in the tool, and electronic data processing means (DPM) operatively connected to the reflectometer for controlling the conditions of processing in the fabrication tool. The data processing means is programmed to: store target values for the wafer property (or properties) to be measured; store measured values of the same property (or properties) for a series of wafers processed in sequence in the fabrication tool; compare the measured values to the target value to determine the existence of departures of the measured values from the target; analyze the departures of values to determine the existence of a trend, and to distinguish any such trend from normal statistical variations in the process; relate possible changes of processing conditions in the fabrication tool to resulting changes in the wafer state properties (such as through an empirically determined statistical model); and, based upon that relationship and the observed trend of departures from the target values, effect such changes in processing conditions as will reduce the deviation, from the target value, of the measured property in wafers subsequently processed in the fabrication tool.

The apparatus of invention will normally include means for calibrating the reflectometer by measuring reflectance from a reference surface, the calibrating means being such as to enable calibration without interruption of processing operations carried out in the fabrication tool. The data processing means may be further programmed to store and utilize historical data based upon measurement made and, for specific applications, it may be programmed: (1) to measure properties of epitaxial layers, including layer thickness, film/substrate transition width, substrate and layer doping levels, alloy concentrations (e.g. SiGe or GaAlAs composition), and doping profiles; (2) to measure oxygen implantation dose and/or implantation energy through multilayered analysis of silicon on insulator structures formed by oxygen ion implantation; (3) to measure the activated carrier concentration level, layer thickness, scattering rate, and morphology of poly-silicon thin films; (4) to measure depth of trenches via interferometry (as described, for example, in Wickramasinghe U.S. Pat. No. 5,392,118); (5) to determine the thickness and composition of oxide thin films doped with chemical species, including boron, phosphorus, fluorine, nitrogen, arsenic and others, or (6) to determine the thickness and composition of a film using a chemometric method, such as (but not limited to) that which is described in the paper by Niemczyk et al. entitled "Determination of BPSG Thin-Film Properties Using IR Reflection Spectroscopy of Product Wafers" (Materials Research Society Symposium Proceedings, volume 324, pages 93–98).

Measurements and targets that may be stored in a database include data describing the process history of the wafers, including data as such wafer and lot ID codes, process chambers, and recipes used to process the wafers, tool, and process state information collected during the wafer processing. Data can come from factory-wide computer systems, the process tool, auxiliary sensors mounted on the process tool including wafer, and/or process state sensors. Target data can be obtained from the process tool, other information systems, or from a database or user interface in the cell control computer system itself.

Methods to identify trends in the presence of noise include the use of Statistical Process Control (SPC) rules to identify non-random excursions of the wafer properties from the target values; run-to-run control algorithms (such that which is provided by the Massachusetts Institute of Technology, and described in the paper by Boning et al. entitled "Practical Issues in Run by Run Process Control" (Proceedings of the Advanced Semiconductor Manufacturing Conference, ASMC 95, Cambridge, Mass., November 1995)) to identify drifts in wafer state properties from the target values; a neural network trained on simulated or historical wafer state data to identify drifts in wafer state properties from the target values; and/or any particular weighted or unweighted historical average of previous wafer measurements to reduce the effects of noise in the estimation of the current trends in the wafer state properties.

For purposes of correcting departures from target values, a statistical design of experiments can be performed to form an empirical phenomenological model of how measured wafer properties vary with changes in various process settings of the tool. Also, the process settings around the local operating setpoint can be perturbed as needed to construct a linear model of the wafer property response to the perturbed setting; in doing so, the perturbations would preferably be small enough to keep the wafer property variations sufficiently small to lie within the desired specification limits, but sufficiently large to be distinguishable from the normal statistical scatter inherent in the process tool and measurements method. A semiconductor Equipment Communication Standard (SECS) interface, a Generic Equipment Model (GEM) interface, IEEE 488, or any other digital interface between the cell controller and the process tool may be employed for adjusting parameters and processing conditions.

Other objects of the invention are attained by the provision of a system for semiconductor wafer fabrication, which system comprises, in addition to the FTIR reflectometer and DPM described, a wafer fabrication tool constructed for carrying out process operations sequentially on a series of wafers. The tool employed typically includes a plurality of chambers for receiving (normally in sequence and by use of automatic transfer means) the wafers being fabricated, and means for changing the conditions of processing in at least one of the tool chambers, such means generally constituting means for changing the settings of the tool. Still other objects are achieved by the use of the system described for carrying out a method of semiconductor wafer fabrication.

The apparatus, system, and method of the invention enable the production of higher quality products with tighter specifications, at lower cost and with reduced scrap, due essentially to the unique application of closed loop process control described. Using the instant technique measurements may be made on every wafer, at a suitably selected point in the fabrication process, and recipe (or other) changes may be made continuously, as necessary to keep the control parameter or parameters on target, or to return them thereto.

Wafer-by-wafer process control is regarded to be a reasonable and practical step in improving semiconductor fabrication. Thin film metrology (TFM) tools can be installed for unobtrusive measurements on most fabrication tools, and most fabrication tools are configured to accept recipe changes via a SECS/GEM interface. Run-to-Run or wafer-by-wafer control (in a single wafer process tool) can be implemented with only minor modification of the basic semiconductor process tool. What is required is a computer cell controller which can bring the following required individual components together: 1) the fabrication tool, 2) at least one wafer state sensor, and 3) a communications and control package on a computer that can manage operating and coordinating the sensor data, the run-to-run control algorithm, and the process tool data.

It has been found that these components can be integrated on a modern, wafer process epitaxial silicon cluster deposition tool. Wafer state data may be obtained by use of an EPI ON-LINE film thickness monitor provided by On-Line Technologies, Inc., of East Hartford, Conn., integrated onto the cooldown chamber of the EPI CENTURA HT single wafer epitaxial silicon cluster tool, available from Applied Materials, Inc., of Santa Clara, Calif. The cell controller software is desirably implemented on a PC, running WINDOWS NT software.

A series of experiments were conducted to evaluate the performance of the system. First, to evaluate the robustness of the sensor and software, a long baseline run without control was performed on a CENTURA with three epi chambers. Film thickness and other data were collected from the sensor on over 800 consecutive wafers. To evaluate the control algorithm, fifty wafers were processed under conditions that simulated several process upsets. A comparison was made to compare the wafer-to-wafer variability under open loop and closed loop control.

DETAILED DESCRIPTION OF THE PREFERRED AND ILLUSTRATED EMBODIMENTS

System Architecture

Figure 1:
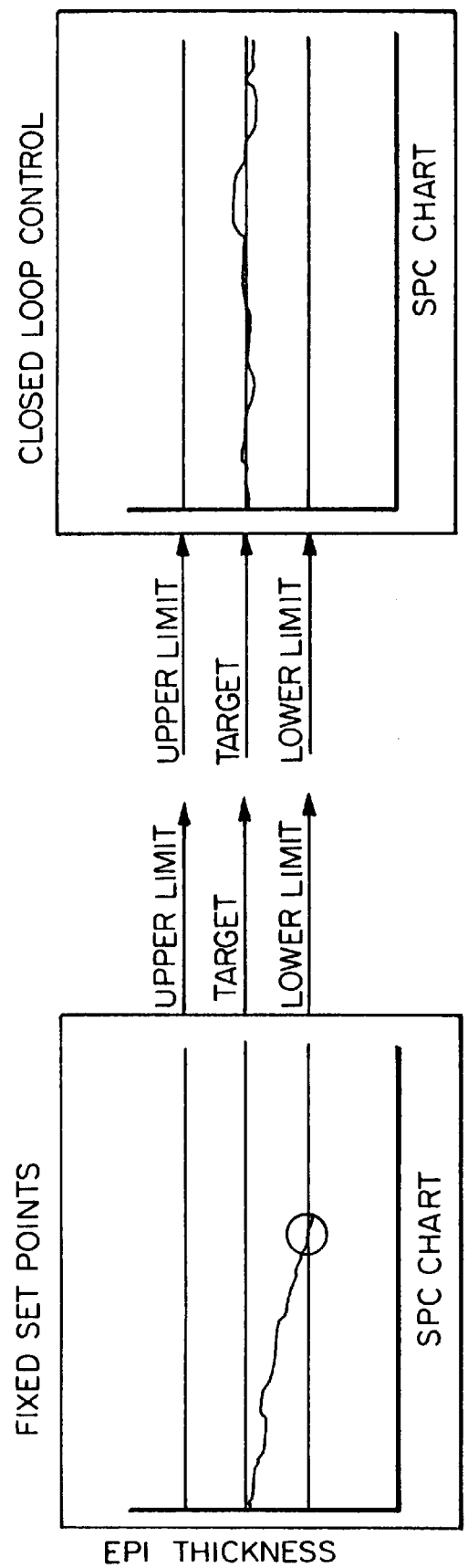
FIG. 1 comprises schematic representations of "a" a control chart of an open loop process and "b" a process with run-to-run feedback control.
Figure 2:
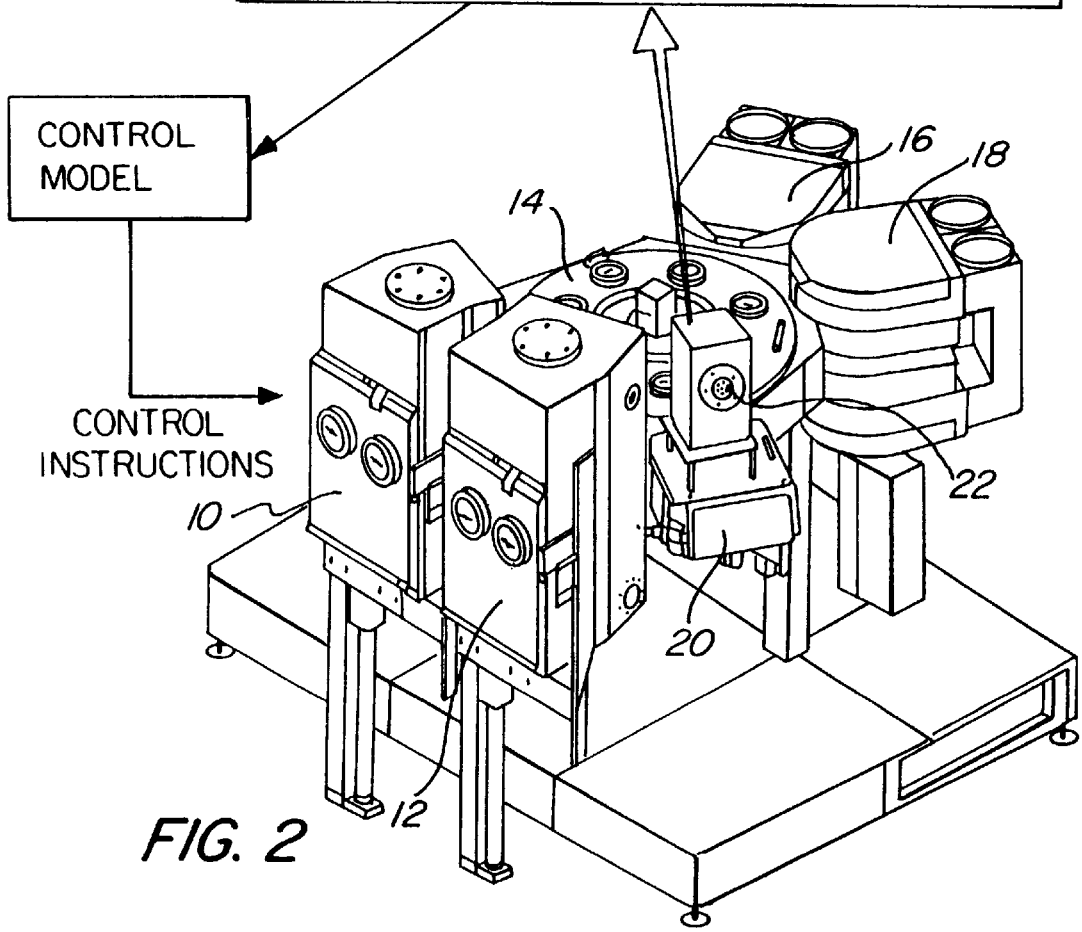
FIG. 2 is a perspective view of a cluster tool system embodying, and adapted for carrying out, the method of the invention.

The physical layout of the instant system is shown in FIG. 2, which illustrates the Applied Materials CENTURA cluster tool, showing two loadlocks 10 and 12, a central robotic transfer chamber 14, process chambers 16 and 18, and a cooldown chamber 20. An On-Line Technologies integrated Fourier transform infrared film thickness monitor 22 is mounted on top of the cooldown chamber 20.

The Reactor

The EPI CENTURA reactor is a state of the art production tool for the fabrication of doped epitaxial silicon layers, typically grown on heavily doped or ion implanted substrate wafers. A typical deposition takes about 100 seconds, and the throughput for a system can be in the range of 30 wafers per hour. Process variables include gas flows, gas dilution (typically with hydrogen), temperature history, and deposition time; the high thermal ramp rates enabled by quartz lamp wafer heating make the EPI CENTURA a rapid thermal process tool.

The EPI CENTURA is also an extremely stable reactor. Excursions in deposition conditions can be largely ignored within a single deposition run and, generally speaking, the wafer-to-wafer reproducibility of the process is extremely high. Because of these features the process is well suited to a run-to-run control system. The capability of tracking material flow within the cluster tool, as well as to read and write recipes to the CENTURA, allow the implementation of a run-to-run control scheme with minimal modifications to the tool, which may be made primarily to allow physical and optical integration of the sensor. In a preferred embodiment, the sensor (FTIR reflectometer) is mounted on the cooldown chamber, thus enabling implementation of the instant system without affecting the design or operation of the deposition process chambers at all, which is a key practical advantage; moreover because, in such an embodiment, the measurements are advantageously performed during the normal cooldown process of the tool, metrology and control are implemented with no affect on the tool throughput or process cycle time.

The On-Line Technologies film thickness monitor which is desirably employed as the sensor means consists of an FTIR spectrophotometer configured for reflectance measurements, a reference mirror mounted in the cooldown and metrology chamber of the cluster tool, and a controller with software to perform data acquisition and analysis. The analysis algorithms are based on a model based analysis of the reflectance that fits a simulated reflectance spectrum to the measured data, as taught for example in Liu et al. U.S. Pat. No. 5,604,581. The fitting parameters, which include variables such as film thickness, epi/substrate doping transition width, and substrate carrier concentration, are selected to provide an accurate and relatively complete description of the optical properties of the wafers using only a few free parameters.

Figure 3A:
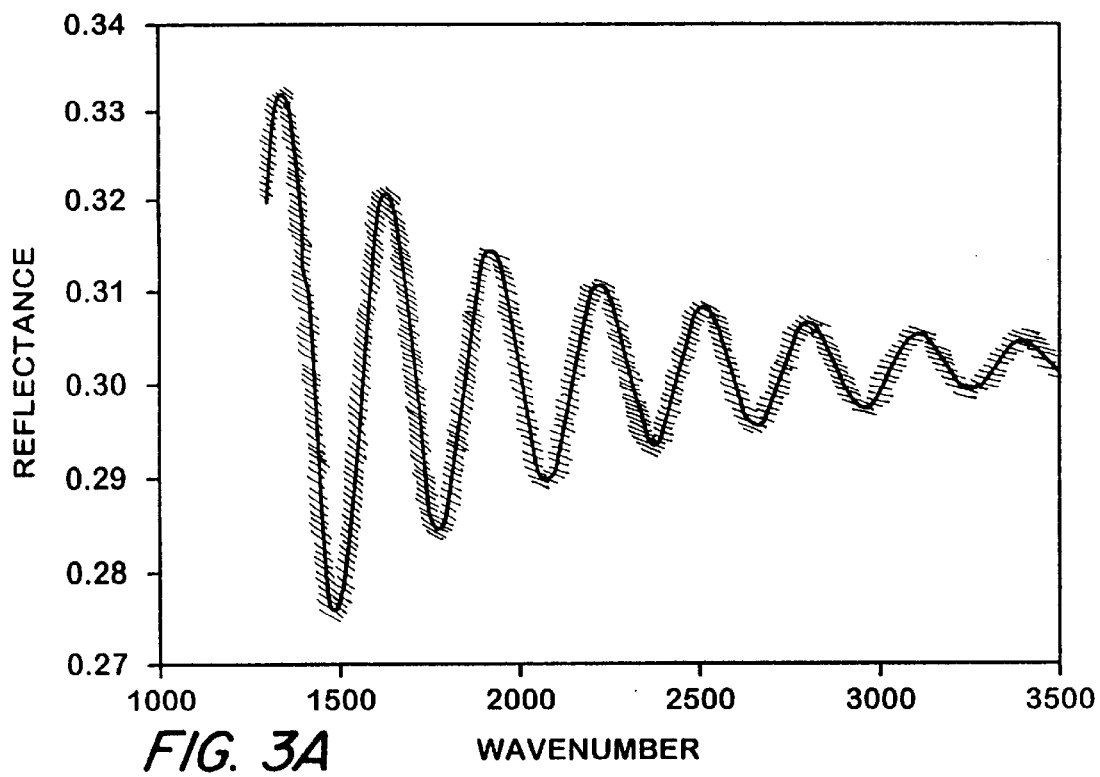
FIG. 3 comprises two graphic presentations of data, the character of which is noted thereon.
Figure 3B:
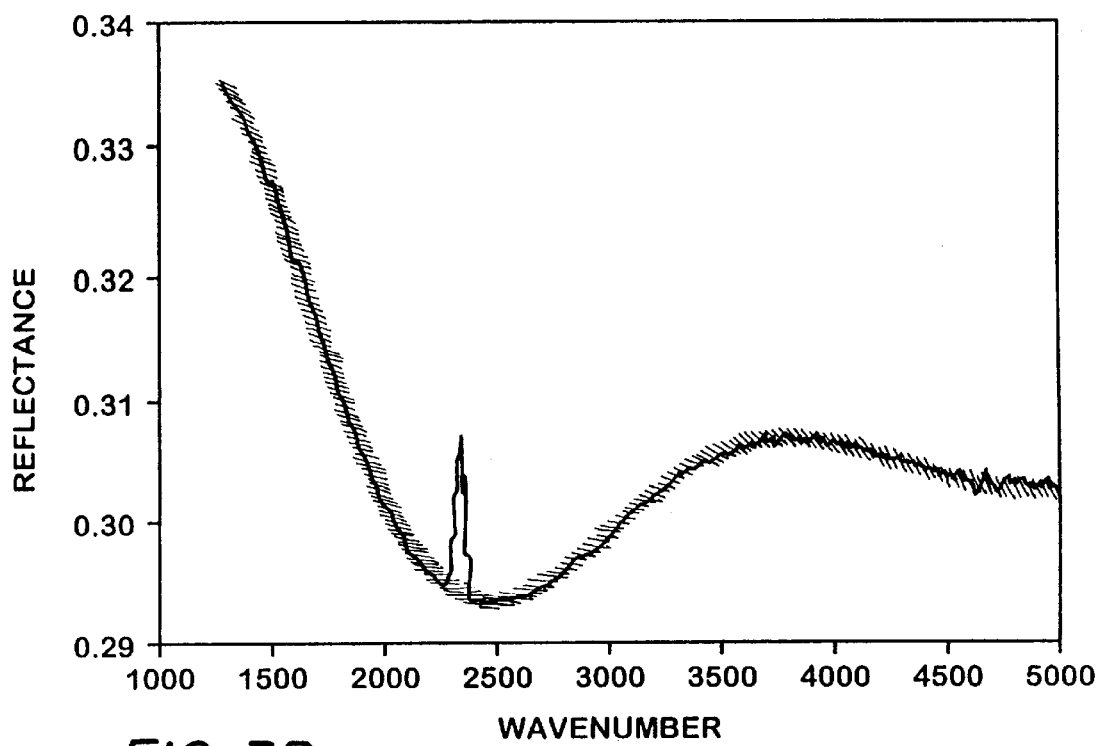
Figure 4:
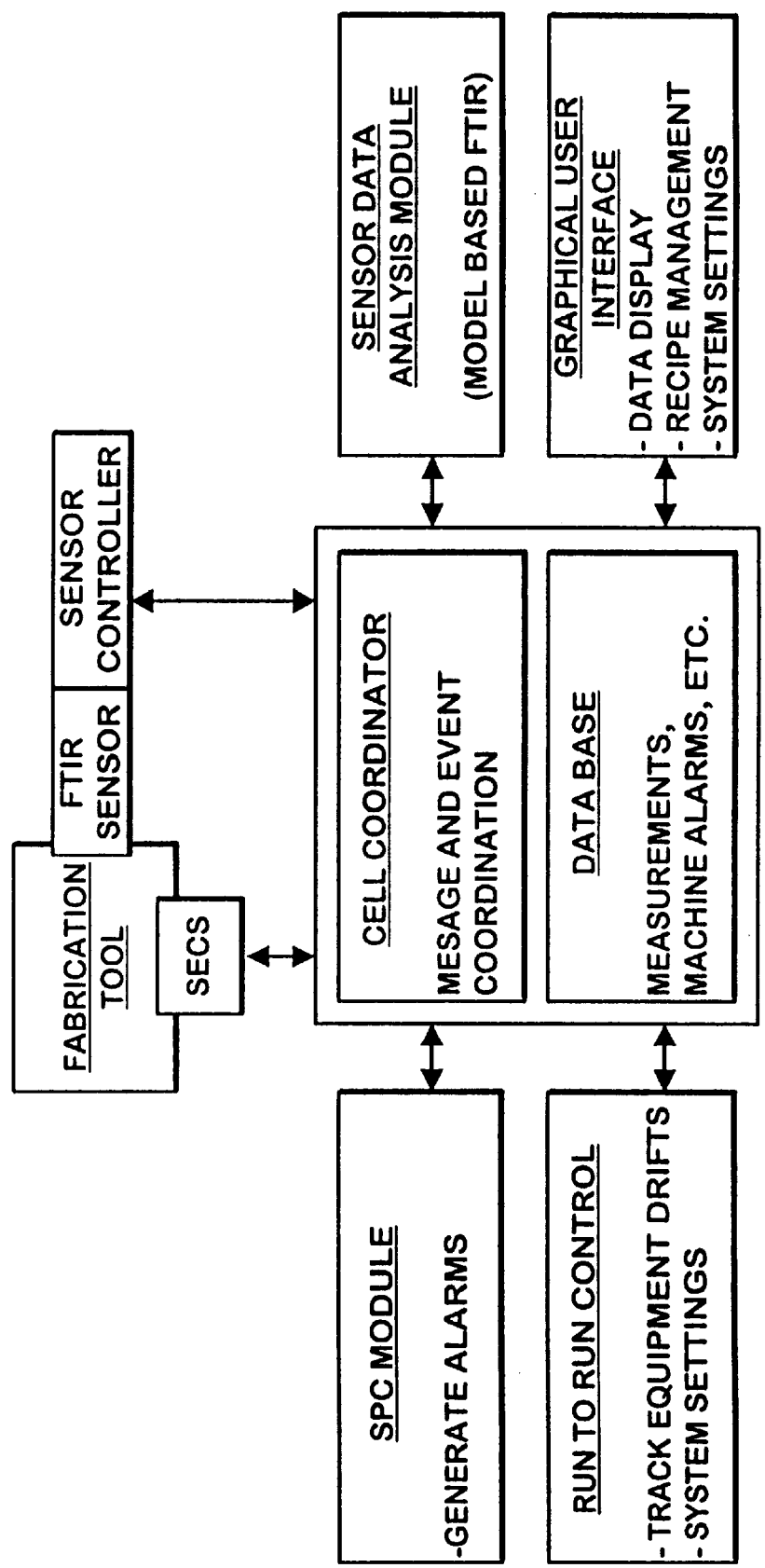
FIG. 4 is a functional block diagram of integrated sensor and cell control software suitable for use in the method, system, and apparatus of the invention.

FIG. 3 illustrates model based fits for two epi samples, including one (FIG. 3(b)) that is well under one micron. In these figures, the layer thickness, the substrate carrier density, and the doping transition width were varied for the fits. The peak in FIG. 3(b) at 2350 wavenumbers is due to atmospheric $CO_2$ in the optical path. FIG. 3 illustrates the excellent accuracy with which the reflectance model accounts for the quantitative aspects of the epi silicon optical properties.

The epitaxial thickness sensor is fully automated. Data are collected, analyzed, and archived without operator interaction. The cluster tool robot provides wafer handling to load and unload wafers. Calibration is automated as well, and employs a standard reference material mounted within the cooldown chamber, allowing for frequent and non-interfering corrections for spectrometer drift.

The Cell Controller Software

The Software Architecture

Figure 5:
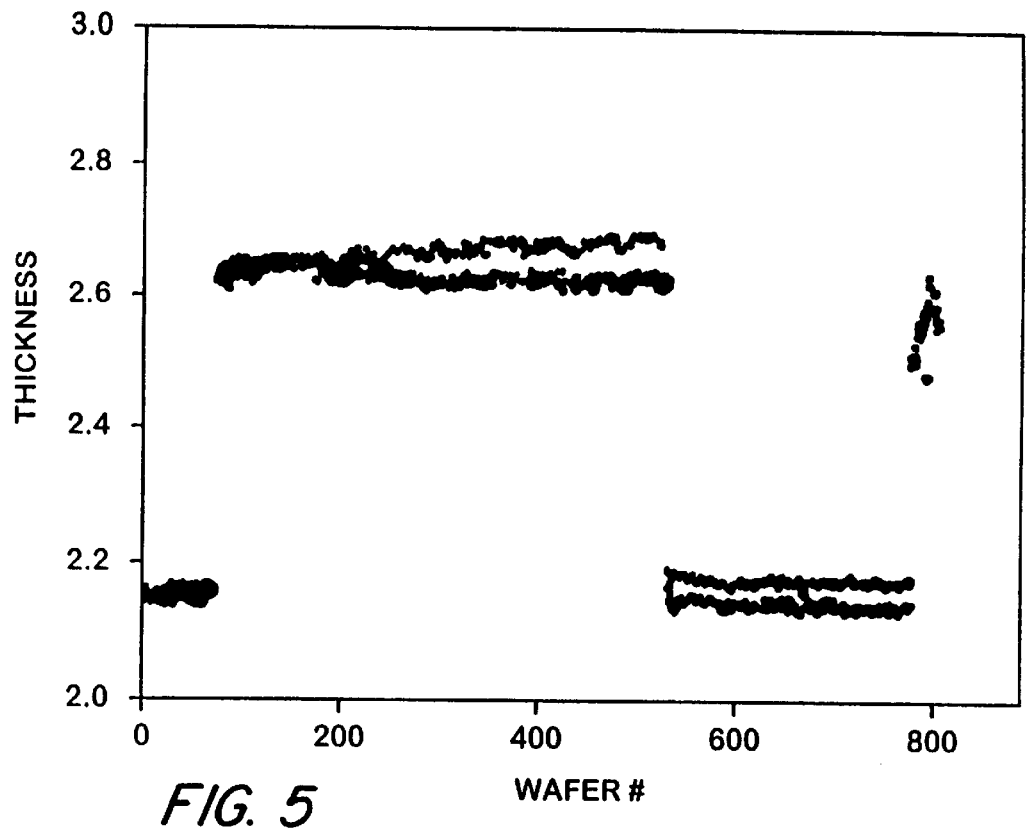
FIGS. 5 through 9 are graphic presentations of data, the specific character of which is noted adjacent each figure.

The functional modules of the preferred system are shown as a block diagram in FIG. 5. In operation, the sensor performs measurements on each wafer as it passes through the cooldown chamber. The sensor data analysis module performs a model based analysis of the spectrum (or spectra, in those instances in which the system of the invention is constructed and configured for the collection of data from multiple measurement points) to extract the epitaxial layer thickness. The run-to-run control module receives the data, and analyzes the data for drifts. If a drift is detected the controller uses a reactor model to compute a recipe update for the next wafer, which compensates for the drift, and sends the updated recipe to the cell coordinator, which routes the new recipe to the cluster tool via the SECS port. The graphical user interface presents the data in control chart or spreadsheet format.

The Run-to-Run control Algorithm

The preferred system employs a linear exponentially weighted moving average (linear EWMA) controller. Generally speaking, this type of controller is useful when a process has multiple control inputs as well as multiple outputs. The process must be sufficiently stable that its control surface model can be linearized about a local operation point. In the experiments described here, the EWMA controller was used to estimate the rate, but the actual deposition rate was not controlled; rather, the deposition time was modified to compensate for drifts in the rate.

Several works have discussed the effectiveness of the linear EWMA run-to-run controller in controlling approximately linear (or more precisely affine) processes in the face of process noise and drift. (See for example T. Smith, D. Boning, J. Moyne, A. Hurwitz, and J. Curry, "Compensating for CMP Pad Wear Using Run by Run Feedback Control," VLSI Multilevel Interconnect Conference, pp. 437–440, Santa Clara, Calif., June 1996; and E. Sachs, A. Hu, and A. Ingolfsson, "Run by Run Process Control: Combining SPC and Feedback Control," IEEE Trans. Semi. Manuf., vol. 8, no. 1, pp. 26–43. 1995.) This effectiveness comes in part from the simple model adaptation strategy used by this controller. The linear EWMA controller assumes a linear process model of the form:

$$\tilde{y}_r[n] = \tilde{A} x[n] + \tilde{b}[n]$$

where $\tilde{y}_r[n]$ represents a p by 1 vector of model outputs, n indicates a discrete "run" of the process, $\tilde{A}$ represents a p by q fixed "gain" matrix from the q by 1 vector of process inputs, $x[n]$, and $\tilde{b}[n]$ represents a p by 1 vector of model offsets. The offset vector is updated using the vector of measured outputs, $\hat{y}_r[n]$, to obtain a vector of measured offset terms, $$\hat{b}[n] = \hat{y}_r[n] - \tilde{A} x[n],$$

which is then used to update the current offset term using an exponentially weighted moving average (EWMA) of the form $$\tilde{b}[n+1] = W \hat{b}[n] + (I - W) \tilde{b}[n],$$

where $W = \text{diag}([w_1 \ldots w_m])$.

This update constitutes a smoothing (or filtering) of measurements of the offset term in order to adapt the process model to account for recent changes in the process. The amount of smoothing performed for the $i^{th}$ output is a function of the EWMA weight, $w_i$. Higher weights indicate recent measurements are weighted more in each update, and therefore indicate less filtering. This method is effective for many processes in the semiconductor industry; this is so because many processes are subject to small shift or drift offset changes in the overall equipment state, but the underlying process dependencies (gain matrix entries) do not change. The epitaxial silicon process is a good example of this type of drift disturbance. However, the drift rate is relatively independent of the process settings (within a neighborhood around the optimal setting). This factor is central to the success of the EWMA controller, because the control strategy makes the assumption that the process offsets vary (and therefore should be monitored with filtered estimates), but the process gains do not change substantially (and can therefore be utilized with the estimates of the offsets to generate new process recipes).

The EWMA run to run controller uses the above estimation scheme to track the process parameters of drifting or shifting processes. A typical parameter might be the deposition rate of a particular process. The controller then utilizes this updated process model to make changes to the processing recipes. In the general framework, the controller might adjust the equipment settings, x[n], such that the deposition rate is controlled to a specified value. This is done by substituting the desired output in for ỹ[n] in (1), and solving the equations for the process settings, x[n]. For multiple inputs and multiple outputs, this solution process may be quite complicated, and often requires the use of very stable linear solvers.

A second method for control, which has been employed in this work, is to utilize the updated model for the deposition rate to make changes to the deposition time. This control strategy is often used to reduce the amount of changes in the processing conditions or to simplify the control scheme. In this scenario, the deposition thickness, $\tilde{y}_t[n]$, is a function of the process rate, $\tilde{y}_r[r]$, and the deposition time, t[n], $$\tilde{y}_t[n] = \tilde{y}_r[n] \cdot t[n].$$

The controller updates the model for $\tilde{y}_r[n]$, substitutes the desired thickness in for $\tilde{y}_t[n]$, and then solves for the deposition time, t[n].

Experimental Results

Baseline tests were carried out by running a set of wafers through a three chamber EPI CENTURA cluster tool, and integrated in-line thickness measurements were performed on all the wafers using the On-Line Technologies EPI ON-LINE Thickness Monitor. The measurements spanned 89 hours of production of 809 commercial epitaxial silicon wafers. As described above, the FTIR was mounted on the cooling chamber of the cluster tool. The overall thickness results are shown as a scatter plot in FIG. 5. Several batches of wafers of different epi thickness were run during the period of investigation, the first batch of wafers having an epi thickness of ~2.15 μm, the second a thickness of ~2.65 μm, the third a thickness of ~2.16 μm, and the fourth a thickness of ~2.6 μm.

Figure 6:
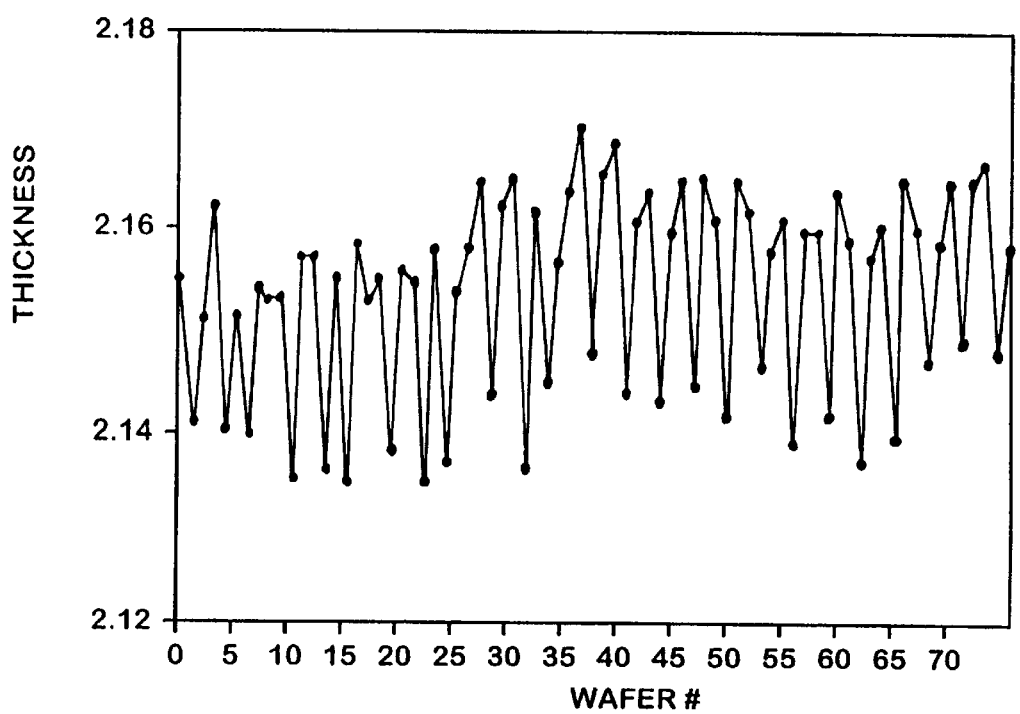

FIG. 6 shows details for the first batch of wafers (wafers 0 to 74). As can be seen, one out of every three data points is different from the two others. This trend appears to be caused by one of the three chambers (the second) of the fabrication tool being slightly out of tune from the other two. The repetitive pattern (i.e., thickness equal to ~2.16 μm, ~2.14 μm, ~2.16 μm and repeat) can be clearly observed after wafer #41, while for lower wafer numbers the pattern is sometimes slightly out of sequence. The sequence variations are attributed to temporary pauses in the tool operation, which allowed the system to reset its chamber sequence.

Figure 7:
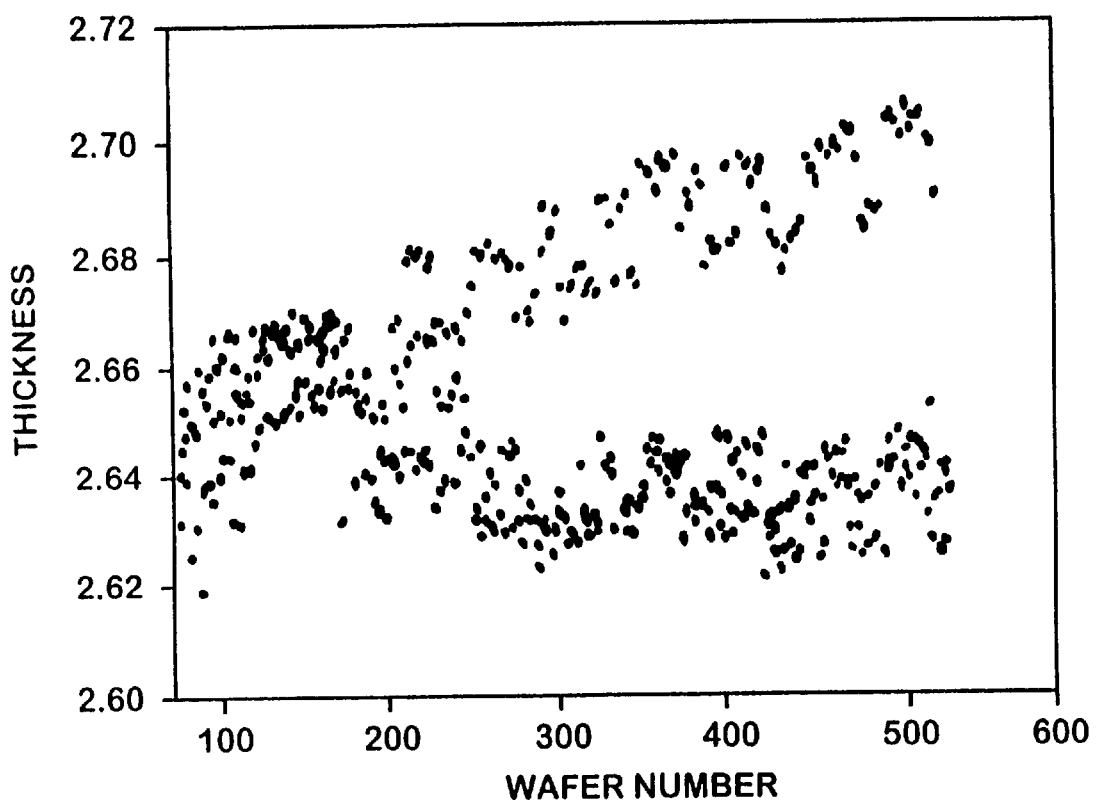

FIG. 7 shows the results for the second batch of wafers (wafers 75 to 537). The threefold periodicity in the data was observed without interruption for this entire sequence. The wafers with the different (in this case higher) epi thickness correspond, as in the case of the first batch, to the second chamber. In addition, in the case of the second chamber, it appears that an upward drift in the thickness occurs as a function of time, while no significant drift was seen for the wafers of the two other chambers (at least in the region comprised of wafer #300 to wafer #537).

The data presented in FIGS. 5–7 show that: 1) the sensor provided reliable thickness results for nearly all of the wafers during an extended process run, and 2) drift within the different cluster tool process chambers occurred and were identifiable from the sensor data. In particular, during these runs the second chamber seems to have behaved slightly differently from the two others and, in some cases, to produce a noticeable drift in thickness with time.

Control runs were carried out by processing a similar series of wafers in a single chamber system while the run-to-run controller was enabled. For these experiments a setpoint was specified for thickness. The run-to-run controller estimated the current deposition rate by performing an exponentially weighted moving average of the measured thickness on the previously processed wafers. The deposition time was updated after each wafer was processed. The new deposition time was calculated as the target thickness divided by the EWMA estimated rate. The recipe changes were automatically downloaded to the cluster tool via the SECS port after each measurement. Process upsets were simulated by deliberately modifying the temperature in the recipe during the process.

Figure 8:
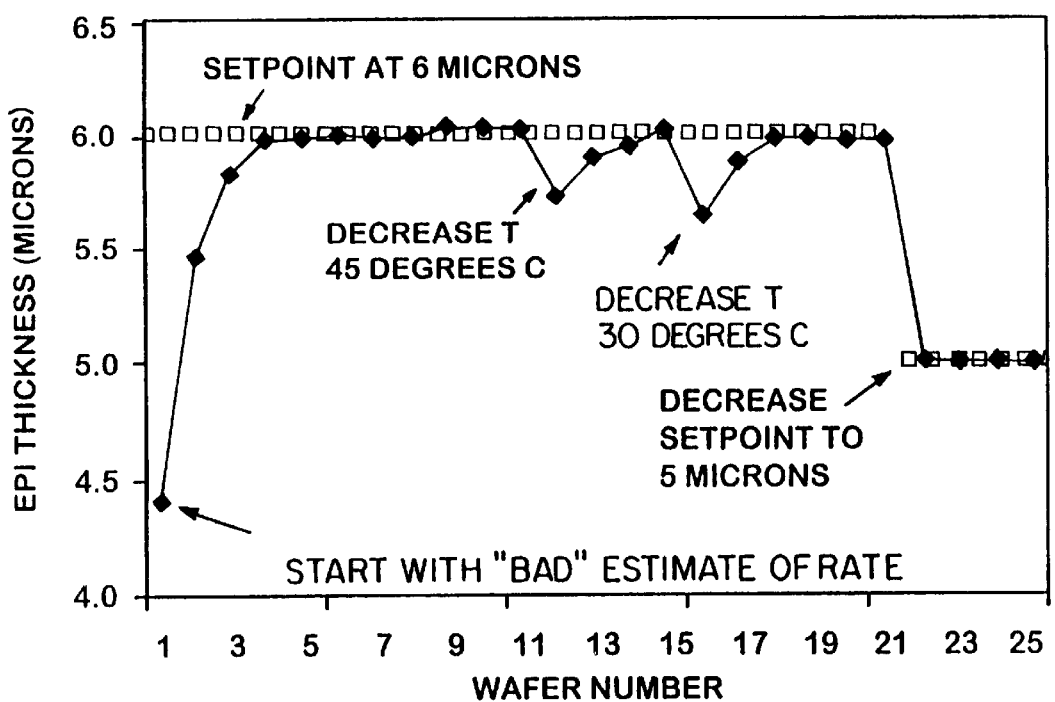

The performance of the system under run-to-run control, as it reacquired the target thickness values, is shown in FIG. 8. First, the system was started running an epi recipe for films of 4.5 microns, substantially thinner than the target thickness of six microns entered into the run-to-run control module. Within four wafers the controller reached steady state at the target thickness. The deposition time after capture of target thickness was 100 seconds. Next, a small process upset was simulated starting at wafer 9. For this simulated process upset the recipe was modified so as to increase the growth temperature by 15° C. This resulted in a change in growth rate of less than 1%. Because the granularity of the deposition time parameter is 1%, roundoff resulted in no modification to the recipe. A small increase in thickness is therefore observable in wafers 9–11. Next, the temperature was decreased by 45° C. (wafer 12). This resulted in a significant decrease in growth rate. During the next four wafers the controller adjusted the deposition time to bring the epi thickness back to the target value. The temperature was again decreased starting at wafer 16, and again, the controller brought the film thickness back to the target value during the next four wafers. At wafer 22, the target thickness of the controller was reduced to 5 microns, but the growth conditions were not modified. The run-to-run controller correctly modified the deposition time and brought the thickness to the new target value in the next wafer.

The results show that the run-to-run control algorithm was able to correct large process excursions. For this process, the deposition time granularity of one second limited the control precision to 1% of the thickness, given that these depositions were nominally 100 seconds in duration. As described previously, to reduce the susceptibility to normal noise inherent in a process, the run-to-run controller desirably uses an exponentially weighted moving average to provide a smoothed estimate the rate. The α parameter which determines relative weight of each previous sample was set to 0.7. This value of α was consistent with the observed behavior, i.e., that it took four samples to recover from a discontinuous process upset.

Figure 9:
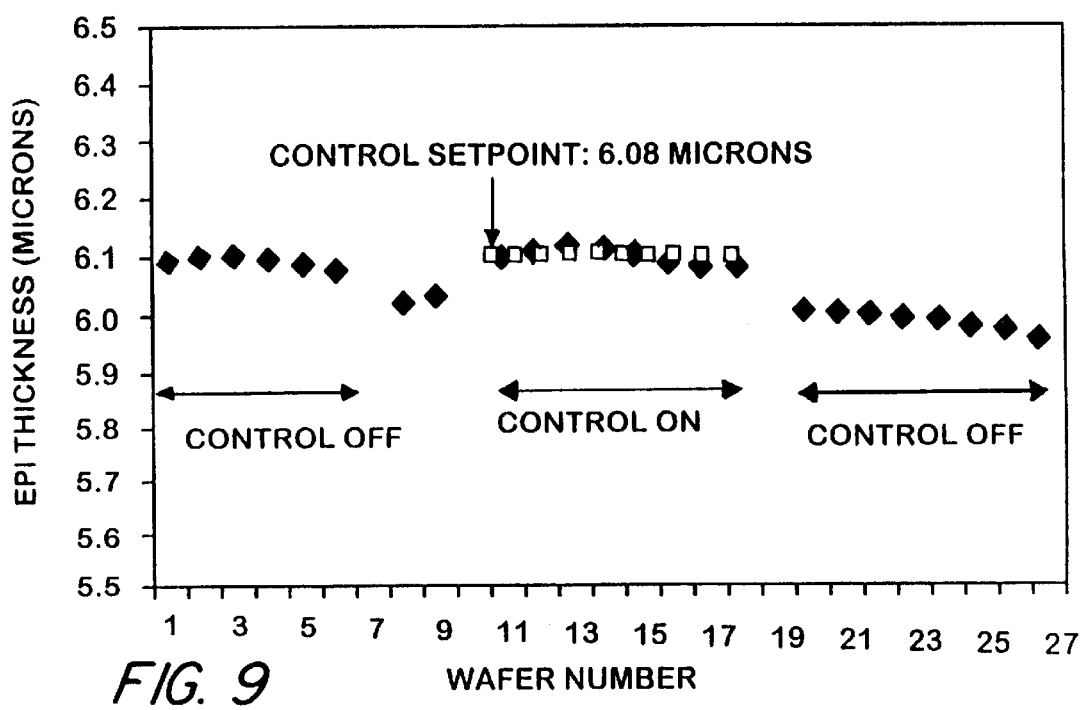

A second set of wafers were processed to assess the stability of the process while under run-to-run control, the results of which are shown in FIG. 9. In these tests, the first six wafers were used to estimate the film thickness associated with the chosen recipe. After an unscheduled shut down (due to a scrubber fault), two more wafers were processed under open loop control; it is to be noted that the film thickness drifted for these two wafers. The target thickness calculated from the average thickness of the first six wafers was used as the setpoint for the second eight wafers processed with the run-to-run control module enabled. The last eight wafers were then processed with the run-to-run control disabled. It is not known why the thickness dropped suddenly for the last eight wafers in this test, but it should be noted that, had the run-to-run controller been enabled, these last eight wafers would have been virtually identical to the other wafers processed while the controller was enabled. It is also to be noted that, in this series of wafers, the short term variability from wafer to wafer was not degraded by the run-to-run controller, and that in fact the run-to run controller appeared to be controlling process shifts and drifts rather effectively.

A primary benefit of closed loop control for the instant process lies in improved overall equipment effectiveness, estimated to be about 22% for embodiments such as that described. A 50% reduction of monitor wafer usage is believed to be likely, and is itself a powerful driver for this technology. A modern 200 mm epi line producing 50,000 wafers per month typically allocates 4% of its production capacity to monitor wafers which are not sold.

Thus, it can be seen that the present invention provides a novel cell control method, apparatus, and system whereby and wherein trends of departures from target values of one or more properties of semiconductor wafers can be detected in line and during fabrication, and whereby and wherein adjustments can be made in processing conditions so as to minimize or eliminate (or, at least, reduce) such departures in wafers subsequently fabricated. The method, apparatus, and system of the invention are especially well suited for the fabrication of semiconductor wafers on a production basis, and they enable measurement and control of many properties that are essential to satisfactory wafer performance, especially layer thickness and composition; these advantages are due largely to the robustness and broad range of measurement capabilities of the FTIR sensor.

In a preferred embodiment, successful closed-loop control of an epitaxial silicon deposition process is demonstrated on a commercial, single wafer cluster tool using an integrated FTIR spectrometer mounted on the cluster tool cooldown chamber and a software package incorporating a run-to-run control algorithm, in which process recipe modifications to the process are computed and uploaded to the cluster tool automatically using the SECS communication port, and process drifts and chamber-to-chamber differences in the silicon film thickness are monitored over an extended process run using the integrated thickness monitor. The feasibility of using wafer-state feedback to control the fabrication process for epitaxial silicon is also demonstrated, and indicates that significant improvements in overall equipment effectiveness, and reductions in production costs, can be obtained through use of the technology disclosed.

Having thus described the invention, what is claimed is:

1. Apparatus for in-line control of a semiconductor wafer fabrication tool, comprising:
   a Fourier transform infrared reflectometer for measuring, in a fabrication tool, at least one property of each of a series of semiconductor wafers sequentially processed in the tool; and
   electronic data processing means operatively connected to said reflectometer for controlling the conditions of processing in the fabrication tool, said data processing means being programmed to perform the functions:
   (a) store target values for said at least one wafer property that is to be measured;
   (b) store measured values of said at least one property for a series of wafers processed in sequence in the fabrication tool;
   (c) compare said measured values to said target value to determine the existence of departures of said measured values from said target value;
   (d) analyze said departures of values to determine the existence of a trend therein, and to distinguish any such trend from normal statistical variations in the process;
   (e) relate possible changes of processing conditions in the fabrication tool to resulting changes in the wafer state properties; and
   (f) based upon the relationship established by said function (e), and said trend of departures of values, as so distinguished, effect such changes in processing conditions as will reduce the departure, from said target value, of said at least one property in wafers subsequently processed in the fabrication tool.

2. The apparatus of claim 1 additionally including calibrating means for calibrating said reflectometer by measuring reflectance from a reference surface, said calibrating means enabling calibration without interruption of processing operations carried out in the fabrication tool.

3. The apparatus of claim 1 wherein said data processing means is further programmed to store and utilize historical data based upon measurements made.

4. The apparatus of claim 1 wherein said data processing means is programmed to measure properties of epitaxial layers of the wafer.

5. The apparatus of claim 4 wherein said measured properties include layer thickness, film/substrate transition width, substrate and layer doping levels, alloy concentrations, and doping profiles.

6. The apparatus of claim 1 wherein said data processing means is programmed to measure at least one of oxygen implantation dose and oxygen implantation energy through multilayered analysis of silicon on insulator structures formed by oxygen ion implantation.

7. The apparatus of claim 1 wherein said data processing means is programmed to measure the activated carrier concentration level, layer thickness, scattering rate, and morphology of poly-silicon thin films.

8. The apparatus of claim 1 wherein said data processing means is programmed to measure depth of trenches by way of interferometry.

9. The apparatus of claim 1 wherein said data processing means is programmed to determine the thickness and composition of oxide thin films doped with chemical species, said species being selected from the group consisting of boron, phosphorus, fluorine, nitrogen, and arsenic.

10. The apparatus of claim 1 wherein said data processing means is programmed to determine the thickness and composition of a film.

11. A system for semiconductor wafer fabrication, comprising:
   a wafer fabrication tool constructed for carrying out process operations sequentially on a series of wafers, said fabrication tool including a plurality of chambers for receiving wafers being fabricated, and means for changing the conditions of processing in at least one of said chambers of said tool;
   a Fourier transform infrared reflectometer for measuring at least one property of each of a series of semiconductor wafers sequentially processed in said fabrication tool, said reflectometer having optics for receiving spectral reflectance from wafers disposed in a chamber of said fabrication tool; and
   electronic data processing means operatively connected to said reflectometer for controlling the conditions of processing in said one chamber of said fabrication tool, said data processing means being programmed to perform the functions:
   (a) store target values for said at least one wafer property that is to be measured;
   (b) store measured values of said at least one property for a series of wafers processed in sequence in said fabrication tool;

(c) compare said measured values to said target value to determine the existence of departures of said measured values from said target value;

(d) analyze said departures of values to determine the existence of a trend therein, and to distinguish any such trend from normal statistical variations in the process;

(e) relate possible changes of processing conditions in said one chamber of said fabrication tool to resulting changes in the wafer state properties; and (f) based upon the relationship established by said function (e), and said trend of departures of values, as so distinguished, effect such changes in processing conditions as will reduce the deviation, from said target value, of said at least one property in wafers subsequently processed in said one chamber of said fabrication tool.

12. The system of claim 11 wherein said reflectometer is physically integrated with said fabrication tool.

13. A cell control method for semiconductor wafer fabrication, comprising the steps:

(a) providing a multiplicity of semiconductor wafers for processing;

(b) providing a system in accordance with claim 11;

(c) storing in said data processing means of said system a target value for said at least one wafer property;

(d) operating said fabrication tool for carrying out process operations on each of a first plurality of said wafers, in sequence;

(e) operating said data processing means to:
  (1) store measured values of said at least one property of said wafers;
  (2) compare said measured values to said target value to determine the existence of departures of said measured values from said target value;
  (3) analyze said departures of values to determine the existence of a trend therein, and to distinguish any such trend from normal statistical variations in the process;
  (4) relate possible changes of processing conditions in said one chamber of said fabrication tool to resulting changes in the wafer state properties; and
  (5) based upon the relationship established between said changes of processing conditions and wafer state properties, and said trend of departures of values, as so distinguished, effect such changes in processing conditions as will reduce the deviation, from said target value, of said at least one property in wafers subsequently processed in said one chamber of said fabrication tool; and (f) operating said fabrication tool, with said changes of processing conditions effected, for carrying out said process operations on each of a further plurality of said wafers, in sequence.

* * * * *